(12) United States Patent  
Wang

(10) Patent No.: US 12,532,780 B2  
(45) Date of Patent: Jan. 20, 2026

(54) HYBRID BONDING FOR SEMICONDUCTOR DEVICE ASSEMBLIES

(71) Applicant: Micron Technology, Inc., Boise, ID (US)

(72) Inventor: Jyun Yang Wang, Taichung (TW)

(73) Assignee: Micron Technology, Inc., Boise, ID (US)

( * ) Notice: Subject to any disclaimer, the term of this patent is extended or adjusted under 35 U.S.C. 154(b) by 600 days.

(21) Appl. No.: 17/893,160

(22) Filed: Aug. 22, 2022

(65) Prior Publication Data

US 2024/0063152 A1 Feb. 22, 2024

(51) Int. Cl.  
*H01L 23/00* (2006.01)  
*H01L 25/065* (2023.01)

(52) U.S. Cl.  
CPC .............. *H01L 24/05* (2013.01); *H01L 24/08* (2013.01); *H01L 24/80* (2013.01); *H01L 25/0657* (2013.01); *H01L 2224/05647* (2013.01); *H01L 2224/05687* (2013.01); *H01L 2224/08059* (2013.01); *H01L 2224/08121* (2013.01); *H01L 2224/08145* (2013.01); *H01L 2224/80203* (2013.01); *H01L 2224/80895* (2013.01); *H01L 2224/80896* (2013.01); *H01L 2224/80948* (2013.01); *H01L 2225/06524* (2013.01); *H01L 2225/06527* (2013.01); *H01L 2924/1431* (2013.01); *H01L 2924/1436* (2013.01); *H01L 2924/1438* (2013.01); *H01L 2924/37001* (2013.01)

(58) Field of Classification Search  
CPC ......... H01L 24/05; H01L 24/08; H01L 24/80; H01L 25/0657; H01L 2224/08121; H01L 2224/08145; H01L 2224/80203; H01L 2224/80895; H01L 2224/80896; H01L 2224/80948  
See application file for complete search history.

(56) References Cited

U.S. PATENT DOCUMENTS

| | | | |
|---|---|---|---|
| 10,910,782 B2* | 2/2021 | Vandroux | H01L 21/02074 |
| 11,264,343 B2* | 3/2022 | Chen | H01L 24/05 |
| 2015/0243537 A1* | 8/2015 | Chen | H01L 21/67207 |
| | | | 438/455 |
| 2020/0006277 A1* | 1/2020 | Wang | H01L 21/0234 |
| 2020/0194396 A1* | 6/2020 | Uzoh | H01L 24/82 |
| 2020/0235063 A1* | 7/2020 | Chen | H01L 25/50 |
| 2021/0028135 A1* | 1/2021 | Said | H01L 24/80 |

(Continued)

*Primary Examiner* — Mamadou L Diallo  
(74) *Attorney, Agent, or Firm* — Dorsey & Whitney LLP

(57) ABSTRACT

A semiconductor device assembly including a first semiconductor die having a first dielectric region and a first bond pad that are disposed on a first side of the first semiconductor die; a second semiconductor die having a second dielectric region and a second bond pad that are disposed on a second side of the second semiconductor die; and a hybrid bonding interface between the first side of the first semiconductor die and the second side of the second semiconductor die, the hybrid bonding interface including a gap free metal-metal bonding region between the first and the second bond pads and a gap free dielectric-dielectric bonding region between the first and the second dielectric regions, wherein the dielectric-dielectric bonding region includes a nitrogen gradient with a concentration that increases with proximity to the metal-metal bonding region.

20 Claims, 7 Drawing Sheets

(56) References Cited

U.S. PATENT DOCUMENTS

| | | | |
|---|---|---|---|
| 2021/0181510 A1* | 6/2021 | Katkar | G02B 27/0172 |
| 2021/0242152 A1* | 8/2021 | Fountain, Jr. | H01L 24/80 |
| 2021/0265206 A1* | 8/2021 | Clarke | H01L 21/76873 |
| 2021/0305202 A1* | 9/2021 | Uzoh | H01L 24/80 |
| 2022/0139867 A1* | 5/2022 | Uzoh | H01L 24/80 438/107 |
| 2022/0139869 A1* | 5/2022 | Gao | H01L 24/80 438/455 |
| 2022/0208702 A1* | 6/2022 | Uzoh | H01L 24/08 |
| 2022/0285303 A1* | 9/2022 | Mirkarimi | H01L 24/08 |
| 2022/0293541 A1* | 9/2022 | Arumugam | H01L 24/80 |
| 2022/0359463 A1* | 11/2022 | Chen | H01L 21/6835 |
| 2023/0005850 A1* | 1/2023 | Fountain, Jr. | H01L 24/02 |
| 2023/0019869 A1* | 1/2023 | Mirkarimi | H01L 24/80 |
| 2023/0051810 A1* | 2/2023 | Saitoh | H01L 23/20 |
| 2023/0122531 A1* | 4/2023 | Uzoh | H01L 24/03 257/690 |
| 2023/0187317 A1* | 6/2023 | Uzoh | H01L 21/76847 257/751 |
| 2023/0197655 A1* | 6/2023 | Theil | H01L 24/05 257/773 |
| 2023/0268300 A1* | 8/2023 | Uzoh | H01L 25/0657 257/690 |
| 2023/0299029 A1* | 9/2023 | Theil | H01L 24/80 257/781 |
| 2023/0361074 A1* | 11/2023 | Uzoh | H01L 24/95 |
| 2023/0386891 A1* | 11/2023 | Fournel | H01L 21/76251 |
| 2023/0395466 A1* | 12/2023 | Chuang | H01L 21/02183 |
| 2024/0006380 A1* | 1/2024 | Nad | H01L 21/4857 |
| 2024/0030169 A1* | 1/2024 | Kim | H01L 24/08 |
| 2024/0213191 A1* | 6/2024 | Theil | H01L 24/03 |

\* cited by examiner

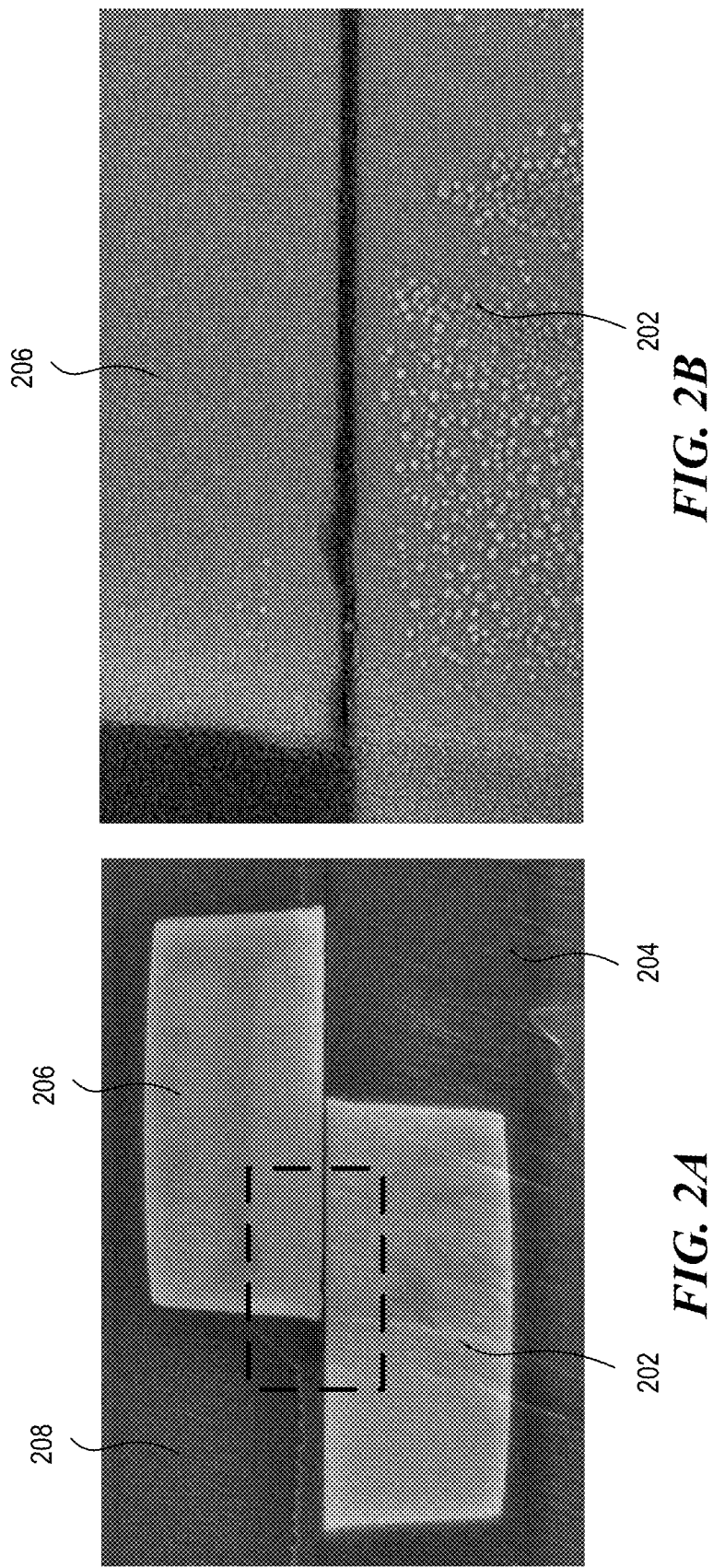

HYBRID BONDING FOR SEMICONDUCTOR DEVICE ASSEMBLIES

TECHNICAL FIELD

The present disclosure generally relates to semiconductor devices, and more particularly relates to modified copper dishing in hybrid bonding for semiconductor device assemblies.

BACKGROUND

Semiconductor packages typically include a semiconductor die (e.g., memory chip, microprocessor chip, imager chip) mounted on a substrate or a semiconductor wafer and encased in a protective covering (e.g., an encapsulating material). The semiconductor die may include functional features, such as memory cells, processor circuits, or imager devices, as well as bond pads electrically connected to the functional features. The process of attaching semiconductor dies on a semiconductor wafer in general refers as chips on wafer (CoW) process, which can increase throughput and reduce difficulties in handling individual semiconductor dies as they continue to shrink in size. Individual semiconductor dies can further be stacked in the semiconductor assemblies.

Hybrid bonding (also refers as fusion bonding or direct bonding) describes a bonding process with minimal intermediate layers between semiconductor dies and semiconductor wafer in the CoW process. The hybrid bonding technique helps semiconductor die manufacturers meet demands for a reduction in the volume occupied by semiconductor die assemblies. In particular, the hybrid bonding processes rely on chemical bonds and interactions between interfacing surfaces of the semiconductor dies and the interface wafer. For example, intermolecular interactions including van der Waals forces, hydrogen bonds, and strong covalent bonds can be formed in the hybrid bonding process to join metal-metal interfaces as well as dielectric-dielectric surfaces at high temperatures and/or compression pressures. Further, the bonding interface between the semiconductor dies and semiconductor wafer may be affected by thermal cycles, e.g., anneal temperatures, that are applied during the hybrid bonding process.

BRIEF DESCRIPTION OF THE DRAWINGS

FIGS. 2A and 2B illustrate a hybrid bonding interface of semiconductor device assemblies.

Figure 1A:
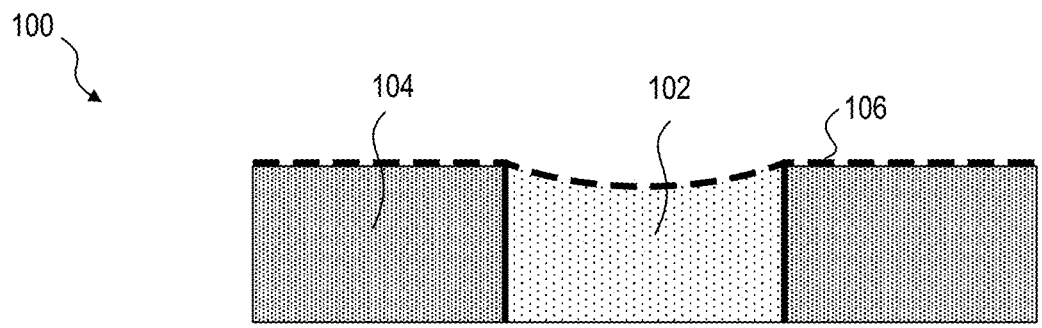
FIGS. 1A through 1C illustrate stages of a hybrid bonding process for forming semiconductor device assemblies.

The drawings illustrate only example embodiments and are therefore not to be considered limiting in scope. The elements and features shown in the drawings are not necessarily to scale, emphasis instead being placed upon clearly illustrating the principles of the example embodiments. Additionally, certain dimensions or placements may be exaggerated to help visually convey such principles. In the drawings, the same reference numerals used in different embodiments designate like or corresponding, but not necessarily identical, elements.

DETAILED DESCRIPTION

CoW assembly is a promising technology for high density package application to overcome the limitations of Wafer-on-Wafer (WoW) boding and improve die stacking process yield and bonding placement accuracy. Conventional CoW assembly includes a frontside to backside (F2B) attachment, i.e., attaching a frontside surface of a semiconductor die or stacks of semiconductor dies on a backside surface of a semiconductor wafer through hybrid bonding, wherein the semiconductor wafer includes macro bumps and has been attached on a carrier wafer through adhesive materials before the CoW assembly.

The joint structures between the semiconductor dies (or between the semiconductor die and the interface die) can be eliminated by utilizing direct bonding schemes, which may also be referred to as zero-BLT configurations. Accordingly, the direct bonding schemes can facilitate reducing overall heights of semiconductor die assemblies or increasing a quantity of semiconductor dies while satisfying height requirements of semiconductor die assemblies. Typically, the direct bonding schemes include two or more dissimilar materials (e.g., electrically conductive materials and dielectric materials surrounding the conductive materials) that are directly bonded to corresponding counterparts. In other words, conductive materials of a first semiconductor die bonded to corresponding conductive materials of a second semiconductor die and dielectric materials of the first semiconductor die bonded to corresponding dielectric materials of the second semiconductor die, respectively. In this manner, the hybrid bonding scheme can form interconnects (electrically conductive paths with zero-BLT) between conductive materials of the first and second semiconductor dies while surrounding dielectric materials provide electrical isolation and structural support for the interconnects.

In general, the direct bonding process includes two stages. First, two dies/wafers (e.g., a top die/wafer, a bottom die/wafer) are attached together such that dielectric materials of the top and bottom dies/wafers are bonded to each other. In some embodiments, the surfaces to be bonded are activated (e.g., using a plasma treatment process) to facilitate bonding of the surfaces. Also, bond pads (including electrically conductive materials) of the top and bottom dies are aligned to face each other to form conductive paths therebetween as described below in more detail. Further, the bond pads may be recessed with respect to surfaces of the dielectric materials (e.g., a bonding interface, a mating interface) such that bonding of the dielectric materials can be accomplished without any interference from protruded bond pads.

Subsequently, the bonded dies/wafers are annealed in an elevated temperature (e.g., post bond annealing) such that the conductive materials of the top and bottom dies may expand toward each other (e.g., due to the mismatch in coefficients of thermal expansion (CTE) between the conductive materials and the dielectric materials) within an open space defined by the recess and the dielectric material surrounding the bond pads. When the surfaces of the top and bottom conductive materials are in contact, the conductive materials are conjoined (e.g., via atomic migration (intermixing, diffusion) from one conductive material to another conductive material) to form permanent bonding—e.g., metallurgical bonding. Once the bonding is formed between the conductive pads, the conductive materials do not separate (or sever) when the bonded dies/wafers are brought to the ambient temperature or operating temperatures of the semiconductor die assemblies.

One of the challenges for conventional hybrid bonding process is the post bond thermal annealing process operated to expand the bond pads with higher CTE to have them physically connected for interdiffusion. The thermal annealing process is implemented to overcome the incoming CMP dishing on the bond pads of the semiconductor die and semiconductor wafer. However, oxidized conductive materials, e.g., metal oxide, may be formed on the bond pads of the semiconductor dies and semiconductor wafer during the thermal annealing process. The metal oxide isolates conductive materials of bond pads facing each other and stops their inter diffusion during the hybrid bonding. As a result, there will be gaps formed and disposed at the hybrid bonding interface, e.g., the metal-metal bonding interface, that are caused by the conductive material oxidation during the hybrid bonding process. The bond pad conductive material oxidation during the thermal annealing process and the generated gaps degrade the hybrid bonding interface for semiconductor device assemblies.

To address these challenges and others, the present technology applies a composite material between the bond pads of a top semiconductor die and a bottom semiconductor die in the CoW semiconductor device assemblies. In particular, composite material can be formed on at least one of the bond pads of the top semiconductor die and the bond pad of the bottom semiconductor die, to facilitate the bond pads inter diffusion in the hybrid bonding. In addition, the present technology provides an example composite material in forms of copper nitride corresponding to bond pads made of copper. The copper nitride composite material can be formed in a microwave plasma process which utilizes nitrogen reaction gas and proper plasma power. In the hybrid bonding process, the composite material performs as an oxidation barrier on the band pads, not only isolating conductive bond pad materials from oxygen but also interconnecting the bond pads of the top semiconductor die and the bottom semiconductor die.

In the present technique, the composite material can be disposed above a recessed top surface of the bond pad of the top semiconductor die and/or the bottom semiconductor die and has a top surface higher than adjacent dielectric region. When attaching the top semiconductor die with the bottom semiconductor die, the composite material fulfills the recessed spaces of the bond pads and makes their interconnections easier. Moreover, the composite material decomposes during the hybrid bonding process, specifically thermal anneal processes in elevated temperatures. At the end of the hybrid bonding process, the composite material will be completely decomposed and converted to the conductive material that makes the bond pads, leading to gap free metal-metal bonds on the hybrid bonding interface.

Figure 1B:
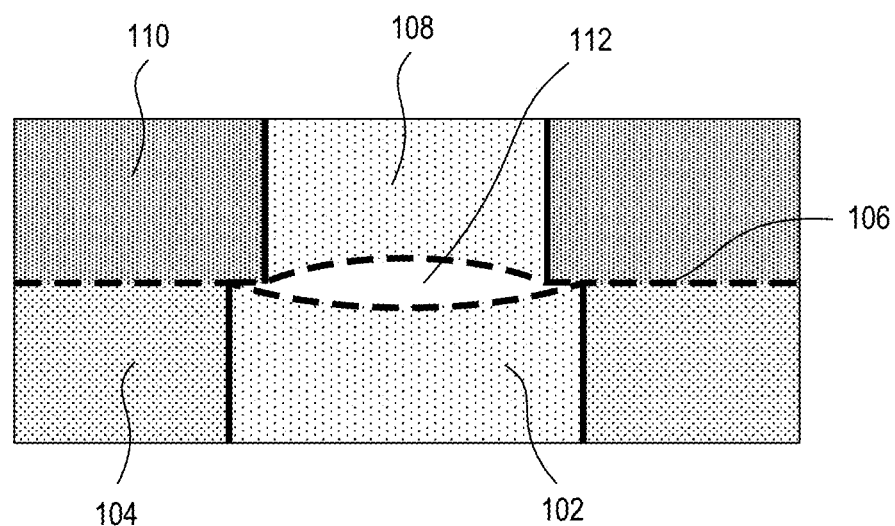
Figure 1C:
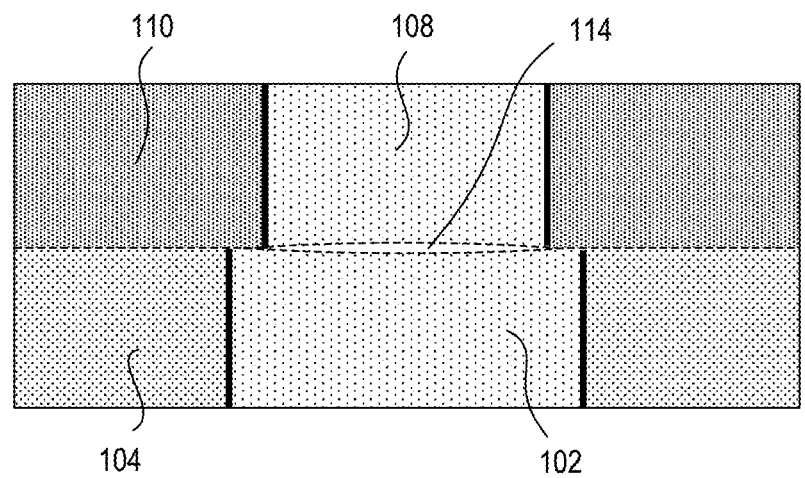

FIGS. 1A through 1C illustrate stages of a hybrid bonding process 100 for forming semiconductor die assemblies. Specifically, the generated semiconductor die assemblies may include non-bonding region between bonded semiconductor dies or gaps between bong pads of bonded semiconductor dies. FIG. 1A illustrates a cross-sectional structure of a bottom semiconductor die incoming to the semiconductor die assemblies. The bottom semiconductor die may include a dielectric region 104 and a bond pad 102, both being disposed on a top surface of the bottom semiconductor die. The dielectric region 104 may include dielectric materials, e.g., silicon oxide or silicon nitride. The bond pad region 102 may be formed by patterning a dielectric layer disposed on the bottom semiconductor die and filling with conductive materials, e.g., copper. As shown, the bond pad 102 is surrounded by the dielectric region 104. In addition, the bond pad 102 is recessed on its top surface, i.e., the top surface of the bond pad 102 is lower than the top surface of the dielectric region 104. The recess of the bond pad 102 may be formed from incoming die surface planarization process, e.g., a chemically mechanically polishing (CMP) process. In general, the bottom semiconductor die including the dielectric region 104 and bond pad 102 are activated in a plasma process, e.g., oxygen plasma process, to form hydroxide (OH) bonding sites 106 on its top surface to prepare for the hybrid bonding in the semiconductor device assemblies.

FIG. 1B illustrates a cross-sectional structure of a semiconductor device assembly after bonding a top semiconductor die to the bottom semiconductor die. As shown, the top semiconductor die also includes a dielectric region 110 and a bond pad 108. The bond pad 108 may be formed by patterning a dielectric layer disposed on a top surface of the top semiconductor die and further filling with conductive materials, e.g., copper. Similarly, the dielectric region 110 may include dielectric materials, e.g., silicon oxide or silicon nitride. The bond pad 108 is recessed in an incoming wafer surface planarization process, e.g., a CMP process, and has a top surface lower than that of the dielectric region 110. The top semiconductor die can be processed in an oxygen plasmas process to generate OH bonding sites 106 on its top surface to facilitate the bonding with the bottom semiconductor die.

As shown, the top semiconductor die is flipped upside down and attached to the bottom semiconductor die by aligning its bond pad 108 to the bond pad 102. By applying a compression pressure close to 1 $Kg/cm^2$ and at room temperature, dielectric-dielectric bonds can be formed (e.g., SiN—SiN covalent bonds) between the dielectric region 104 of the bottom semiconductor die and the dielectric region 110 of the top semiconductor die. Here, the dielectric regions 110 and 104 are fused together but a gap 112 is exist between the bond pads 108 and 102 due to the bond pad recess from incoming procedures.

In general, this hybrid bonding process 100 includes a post bonding thermal annealing step (e.g., at approximately 350° C. for approximately 2 hours or so) to facilitate the bonding between the bond pads 108 and 102. During the thermal annealing step, the metal of the bond pads 108 and 102 (e.g., copper) expand toward each other due to the mismatch in CTE between the metal material and dielectric materials at the bonding interface. However, there may be thermal limitations in the annealing process and the bond pads 108 and 102 may not be in contact. As shown in FIG. 1C, there is still a gap 114 between the bond pads after the thermal annealing process. In some other examples, the bond pads 108 and 102 may be oxidized during the thermal annealing process, e.g., forming copper oxide on the top surfaces of the bond pads 102 and 108. The metal oxidation during the process of hybrid bonding causes non-bonding regions, e.g., gap 114 or metal oxide isolating regions, between the bond pad 102 of the bottom semiconductor die and the bond pad 108 of the top semiconductor die. Here, the conductive materials of the bond pads are not conjoined (e.g., via atomic migration (intermixing, diffusion) from one conductive material to another conductive material) and cannot form permanent bonding between the top semiconductor die and the bottom semiconductor die.

FIGS. 2A and 2B illustrate a cross sectional view of the hybrid bonding interface of semiconductor device assemblies described in FIGS. 1A through 1C. As shown in FIG. 2A, a top semiconductor die having a dielectric region 208 and a bond pad 206 is bonded with a bottom semiconductor die having a dielectric region 204 and a bond pad 202. The dielectric regions 204 and 208 are bonded and the bond pads 202 and 206 are bonded with misalignment along the bonding interface.

FIG. 2B shows a higher magnification cross sectional view of a zoomed in area taken from the bonding interface of FIG. 2A. As described, the conductive material of the bond pads 202 and 206 can be oxidized at its surfaces, e.g., forming insulating metal oxides at the bonding interface, during the hybrid bonding processes. Therefore, the bond pads 206 and 202 cannot be cojoined via atomic intermixing or diffusion to form metallurgical bonding between the top semiconductor die and the bottom semiconductor die. As shown in FIG. 2B, there is a gap close to 20 nm disposed between the bond pads 202 and 206 after the hybrid bonding process 100 described in FIGS. 1A through 1C.

Figure 3A:
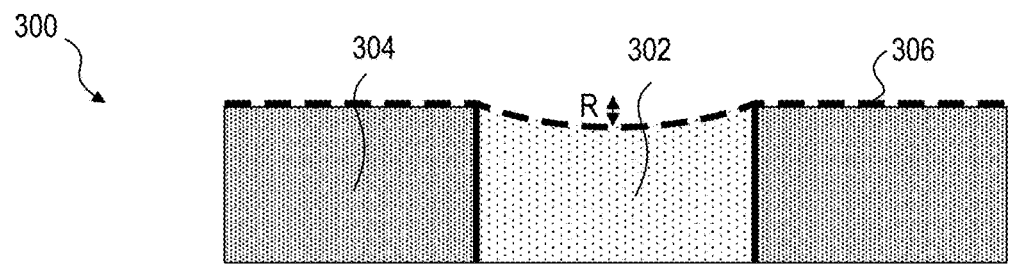
FIGS. 3A through 3D illustrate stages of a hybrid bonding process for forming semiconductor device assemblies in accordance with embodiments of the present technology.

Turning now to FIGS. 3A through 3D, which illustrate stages of a hybrid bonding process 300 for forming gap-free semiconductor die assemblies in accordance with embodiments of the present technology. In particular, the hybrid bonding process 300 can create a gap free metal-metal bonding interface for semiconductor device assemblies. FIG. 3A illustrates a cross-sectional structure of a bottom semiconductor die incoming to the semiconductor die assemblies. This bottom semiconductor die may include a dielectric region 304 and a bond pad 302, both being disposed on a top surface of the bottom semiconductor die. The dielectric region 304 may include dielectric materials, e.g., silicon oxide or silicon nitride. The bond pad region 302 may be formed by patterning a dielectric layer disposed on the bottom semiconductor die and filling with conductive materials, e.g., copper. In this example, the dielectric region 304 may have a thickness ranging from 1 um to 5 um and be made of materials including tetraethyl orthosilicate (TEOS), silicon oxide (SiO), silicon nitride (SiN), silicon borocarbonitride (SiBCN), silicon oxycarbonitride (SiOCN), silicon oxycarbide (SiOC), silicon carbonitride (SiCN), silicon boronitride (SiBN), a low-k dielectric material, or a combination thereof.

In some embodiments, the bottom semiconductor die can be various types of semiconductor dies (e.g., logic dies, controller dies, memory dies, or DRAM products). The logic dies can be configured to exchange electrical signals with the semiconductor dies attached there above and with higher level circuitry (e.g., a host device external to the semiconductor device assembly) coupled with the logic dies. In some embodiments, the bottom semiconductor die includes interposer dies having various conductive structures (e.g., redistribution layers, vias, interconnects) configured to route electrical signals between the attached semiconductor dies thereon and higher-level circuitry—e.g., a central processing unit (CPU) coupled with the semiconductor die through the interposer die.

As shown, the bond pad 302 is surrounded by the dielectric region 304 on the bottom semiconductor die. In addition, the bond pad 302 is recessed from its top surface, i.e., the top surface of the bond pad 302 is lower than the top surface of the dielectric region 304. The recess of the bond pad 302 may be formed from incoming wafer surface planarization process, e.g., a CMP process. It should be understood that FIGS. 3A through 3D depicting the bond pad 302 is not drawn to scale—e.g., a range of a width of the bond pad 302 may vary from 0.2 μm to 10 μm whereas a range of the recess (R) may be less than 5 nm. In some embodiments, the bond pad 302 may be intentionally recessed with respect to surfaces of the dielectric region 304 (e.g., a bonding interface, a mating interface) such that bonding of the dielectric materials can be accomplished without any interference from protruded bond pad material. In some other embodiments, the bottom semiconductor die may include a plurality of bond pads 302 each including a conductive liner (e.g., TaN) and a metal filler (e.g., copper). The bond pads 302 may have a thickness ranging from 1 um to 5 um and a pitch distance around 10 um. Further, the bond pad 302 may be formed from a suitable conductive metal such as copper, aluminum, tungsten, cobalt, nickel, or any other suitable conductive materials using an additive process, including but not limited to, plating, depositing, or any other suitable method of manufacturing.

In some embodiments, the front side of the bottom semiconductor die including the dielectric region 104 and bond pad 102 may be treated with a plasma process to facilitate bonding between dielectric layers and metal pads. Specifically, the front surface of the bottom semiconductor die can be activated in an oxygen plasma process, to form hydroxide (OH) bonding sites 106 thereon to prepare for the hybrid bonding in the semiconductor device assemblies.

Figure 3B:
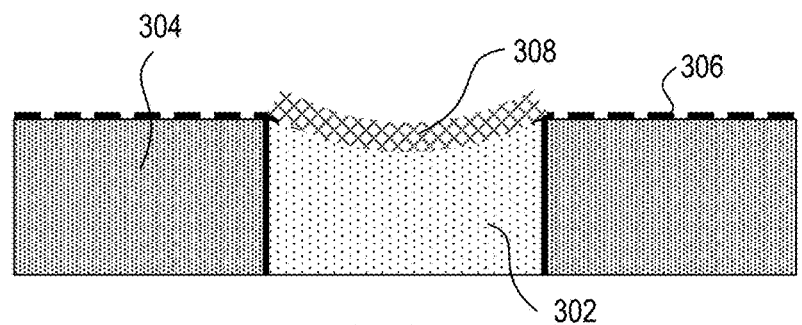
Figure 3C:
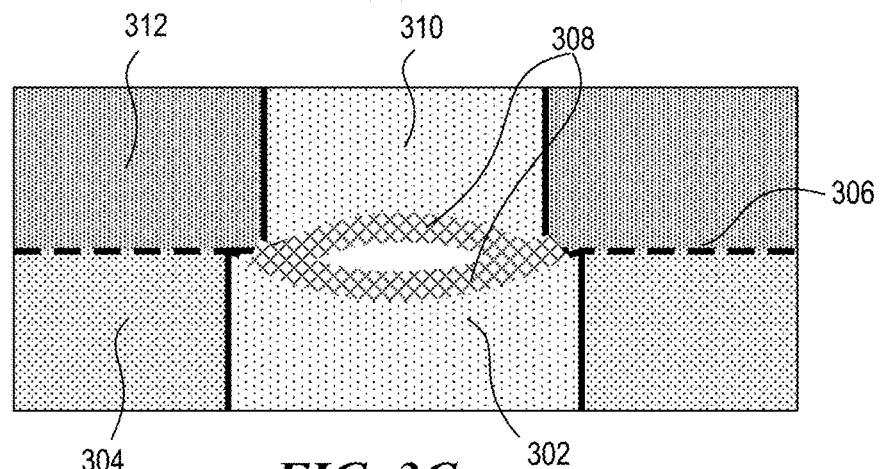

FIG. 3B illustrates a cross-sectional structure of the bottom semiconductor die after forming a layer 308 thereon. Specifically, the layer 308 is selectively grown above the bond pad 302. In some embodiments, the layer 308 is a metal nitride composite, e.g., copper nitride, generated in a plasma deposition process. For example, the copper nitride composite can be formed on the top surface of the pad 308 through a nitrogen ($N_2$) microwave plasma process conducted at room temperature. The $N_2$ microwave plasma process may include flowing nitrogen gas up to 20 sccm, applying a microwave power ranging from 1000 to 3000 Watts, and maintaining a processing pressure ranging from 50 mTorr to 200 mTorr. In this example, the FIGS. 3B and 3C depicting the layer 308 is not drawn to scale—e.g., a range of a thickness of the layer 308 may vary from 10 nm to 30 nm. The growth rate, volume, and/or thickness of the layer 308 may be controlled through adjusting the processing parameters of the plasma process including power, reaction gas flow, pressure, and temperature.

The formation of layer 308 also consumes the bond pad material, by forming the composite on the top surface of the bond pad 302. In some embodiments, the layer 308, e.g., copper nitride, has a thickness close to 30 nm and consumes a layer of copper close 10 nm. This way, the layer 308 may have a top surface higher than the top surface of the dielectric region 304 in a range from 10 nm to 15 nm.

In some embodiments, the layer 308 is a continuous film, e.g., a $Cu_xN_y$ layer, extending on the top surface of the bond pad 308. Additionally, the layer 308 can be discontinuous nano particles. Further, the layer 308 can be formed in specific nano structures including nanowires, nano pillars, and/or nanotubes.

In some embodiments, the layer 308 can be $Cu_3N$ formed in the plasma process by flowing nitrogen under a microwave power to the bond pad 308 comprising copper. The composite $Cu_3N$ can decompose, i.e., converting various phases including $Cu_4N$ and eventually Cu during the hybrid bonding process described through FIGS. 3B through 3D. The decomposition of the layer 308 can be very slow and accelerated in an elevated temperature. In this step, the layer 308 is selectively grown on the bond pad 308, and the dielectric region 304 is not chemically alternated or reacted in the plasma process. The microwave power may be adjusted to be low in avoiding any chemical reactions of the dielectric material with the flowing reaction gas, e.g., Nitrogen, in the plasma process.

In some embodiments, the plasma process used to form the layer 308 can remove metal oxide from the top surface of the bond pad 308. For example, the plasma process can be configured to remove a native oxide layer disposed on the top surface of the bond pad 308. In addition, by forming the layer 308, the conductive bond pad material is further isolated from oxygen, therefore reducing the risk of forming metal oxide layer on the bond pad 308 during the hybrid bonding process 300.

Turning now to FIG. 3C which illustrates a cross-sectional structure of the bottom semiconductor die compressively bonded with a top semiconductor die. As shown, the top semiconductor die includes a dielectric region 312 and a bond pad 310. In addition, the top semiconductor die is flipped upside down and bonded to the bottom semiconductor die by aligning the bond pad 310 to the bond pad 302 and applying a compression pressure. In some embodiments, the top semiconductor die includes a plurality of semiconductor dies. One of the plurality of semiconductor dies of the top semiconductor die is compressively bonded to the bottom semiconductor die.

In some embodiments, the top semiconductor die includes a plurality of semiconductor die stacks including semiconductor dies stacked on top of each other. Each semiconductor die of the stacks has a frontside facing toward the bottom semiconductor die, which may be referred to as an active side of the semiconductor die having memory arrays, integrated circuits coupled to the memory arrays, bond pads coupled to the integrated circuits, etc., and a backside opposite to the frontside. In these examples, the dielectric regions 312 and bond pad 310 may be disposed on the frontside of a bottom semiconductor die of each of the plurality of semiconductor die stacks.

Here, the semiconductor assembly shown in FIG. 3C may contain a hybrid bonding at the bonding interface, which includes dielectric-dielectric bonds between the dielectric regions 312 of the top semiconductor die and the dielectric regions 304 of the bottom semiconductor die. This hybrid bonding also includes metal-metal bonds between the bond pads 310 and 320.

In some embodiments, the dielectric-dielectric bonds between the dielectric regions 312 and 304 can be strong covalent bonds, e.g., SiO—SiO bonds or SiN—SiN bonds, without any gaps nor voids. Further, the dielectric regions 312 and 304 can be fused together by applying heat and/or compression force to the semiconductor device assemblies. For example, the semiconductor device assemblies can go through a first thermal anneal process close to 150° C. for about 4 hours to facilitate forming the dielectric-dielectric covalent bonds between the dielectric regions 312 and 304.

As shown in FIG. 3C, the bond pad 310 of the top semiconductor die can be directly contacted to the layer 308 of the bottom semiconductor die in the hybrid bonding process 300. In particular, the bond pad 310 can be completely joined with the bond pad 302 through the layer 308. As a result, there are no gaps formed at the bonding interface between the bond pads 310 and 302.

Figure 3D:
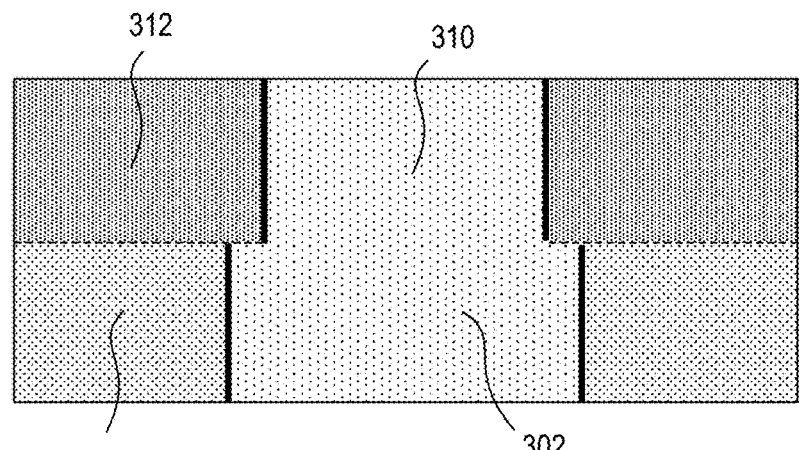

FIG. 3D illustrates a cross sectional structure of the semiconductor device assemblies after completing the hybrid bonding process 300. Specifically, a second thermal anneal process can be conducted to facilitate forming the metal-metal bonds between the bond pads 302 and 310. For example, the second thermal anneal process can be conducted at around 250° C. or lower for about 4 hours or shorter. Through the second thermal annealing process, the bond pads 302 and 310 expand toward each other due to the mismatch in CTE between the conductive material and dielectric materials at the bonding interface, so as to overcome the incoming CMP dishing on each of the top semiconductor die and the bottom semiconductor die.

As described the layer 308 decomposes during the hybrid bonding process, i.e., its decomposition starts when it is formed above the top surface of the bond pad 302 and continues during the first thermal annealing process and specifically the second thermal annealing process. The chemical composition of the layer 308 may change in a trend of raising the content of the conductive materials that are used to form the bond pad 302. For example, the bond pads 302 and 310 may be made of copper and the layer 308 may comprise copper nitride. The as deposited layer 308 may be in a form of $Cu_3N$. During the hybrid bonding process and the thermal annealing processes, the layer 308 may decompose from $Cu_3N$ to $Cu_4N$, and eventually to pure copper.

The metal-metal bonds of the hybrid bonding process 300 are formed by contacting the recessed bond pads 310 and recessed bond pads 302 in an elevated temperature. In this example, the metal-metal bonds can be formed at a relative lower temperature, e.g., at around 250° C., compared to conventional hybrid bonding process which may require a thermal annealing at 350° C. or higher. Moreover, the hybrid bonding process 300 does not require a high temperature to expand the bond pads 302 and 301 so that they are in contact to overcome the recessed ranges (e.g., Rx2) at the hybrid bonding interface between the top semiconductor die and the bottom semiconductor die. Instead, the layer 308 performs as a media to interconnect the bond pads 302 and 301 to facilitate the conductive material diffusion therebetween. Further, higher annealing temperature in conventional thermal annealing process could introduce additional strains from the expanded bond pads to the adjacent dielectric regions, which may cause dielectric region deformation and degrades the hybrid bonding interface. In this example, the lower temperature second thermal annealing process implemented by introducing the layer 308 between the bond pads can effectively reduce the risk of additional stress and deformation on the dielectric regions close to the bond pads misaligned regions.

In some embodiments, lowering the post bond second thermal annealing process temperatures may be beneficial in view of certain materials used during the direct bonding/hybrid bonding process steps—e.g., an adhesive material used to attach the bottom semiconductor die (e.g., semiconductor dies including memory dies, interface dies including logic dies) to carrier substrates. Additionally, or alternatively, the post bond second thermal annealing temperatures can be limited to avoid additional thermal cycles to the semiconductor dies (e.g., dynamic random access memory (DRAM) products) that have completed their processing. In some cases, the additional thermal cycle may have undesired effects to the semiconductor dies.

In some embodiments, the second thermal annealing process continues until the layer 308 sandwiched between the bond pad 302 and the bond pad 310 is completely decomposed. For example, the second thermal annealing process may last for 4 hours or shorter to completely convert the as deposited $Cu_3N$ composite to pure copper. The converted metal as well as the conductive metals of the bond pads 302 and 310 can form a single block of conductive material through the top semiconductor die and the bottom semiconductor die, as shown in FIG. 3D, in forms of gap free metal-metal bonds through the hybrid bonding process 300.

In some embodiments, the nitrogen component of the $Cu_3N$ composite, during the composite decomposition, may diffuse into the dielectric-dielectric bonding regions surrounding the bond pads 302 and 310, or the atmosphere outside the semiconductor devise assemblies. Here, the decomposed nitrogen may be detectable at the dielectric-dielectric bonds interface adjacent to the metal-metal bonds in the semiconductor device assemblies. Specifically, the dielectric-dielectric bonding interface may include a nitrogen gradient with a concentration that increases with proximity to the metal-metal bonds shown in FIG. 3D.

In some other embodiments, the layer 308 can be also formed separately on the bond pad 310 of the top semiconductor die. For example, the layer 308 can be deposited on the top surface of the recessed bond pad 310 in the plasma microwave process. Similarly, the layer 308 can be formed by flowing nitrogen reaction gas and applying plasma power in certain pressures. The processing conditions of the composite 308 on the bond pads 302 and 308 can be similar. In this example, the plasma process may clean the native oxide disposed on the top surface of the bond pad 310 and isolate the bond pad 310 from oxygen during the hybrid bonding process. When the top semiconductor die is bonded to the bottom semiconductor die, the layers disposed on the bond pads 310 and 302 will be in contact. In this example, the bond pad 310 can be completely joined with the bond pad 302 through the layer 308 disposed there between. Similarly, the layer 308 will decompose during the second thermal annealing process, ending up with a gap free metal-metal bonding interface between the bond pads 310 and 302.

Figure 4A:
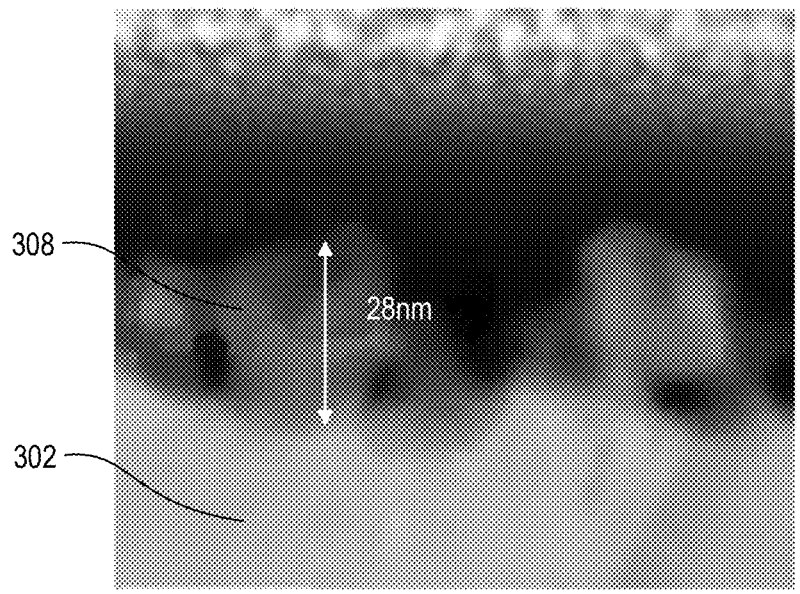
FIGS. 4A and 4B show cross sectional views of semiconductor device assemblies with hybrid bonding interface in accordance with embodiments of the present technology.
Figure 4B:
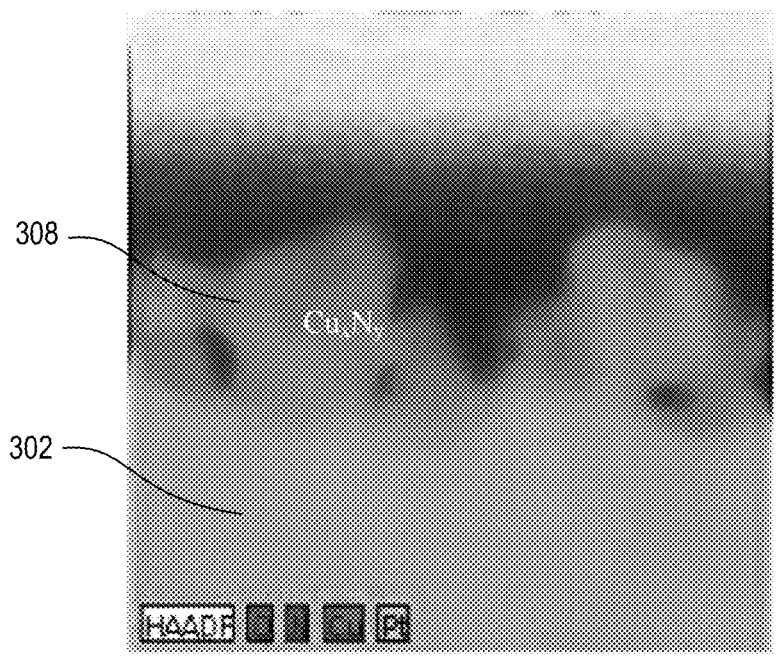

FIGS. 4A and 4B show cross sectional views of the layer 308 disposed on bond pad 302 of the bottom semiconductor die in the semiconductor device assemblies with hybrid bonding in accordance with embodiments of the present technology. FIG. 4A shows a cross sectional TEM image of the composite material $Cu_xN_y$ that is deposited on the top surface of the bond pad 302, corresponding to the assembly stage shown in FIG. 3B. As shown, the composite material are nano particles with a height close to 28 nm. The thickness of the layer 308 is higher than the recess range R (e.g., 5 nm) on the bond pad 302 caused by CMP dishing. In addition, the top surface of the composite 308 may be around 15 nm higher than the adjacent dielectric regions (not shown) considering the consumption of conductive bond pad materials (e.g., 10 nm) during the formation of the layer 308. In this example, the nano particle composites are not continuous on the top surface of the bond pad 302.

FIG. 4B is a dark filed TEM image taken on the same composite material region in FIG. 4A. It can be found that the nitrogen component is uniformly distributed in the $Cu_xN_y$ composite nano particles. Additionally, no copper oxide layers are identified above the composite nano particles 308 or between the layer 308 and the bond pad 302.

Figure 5:
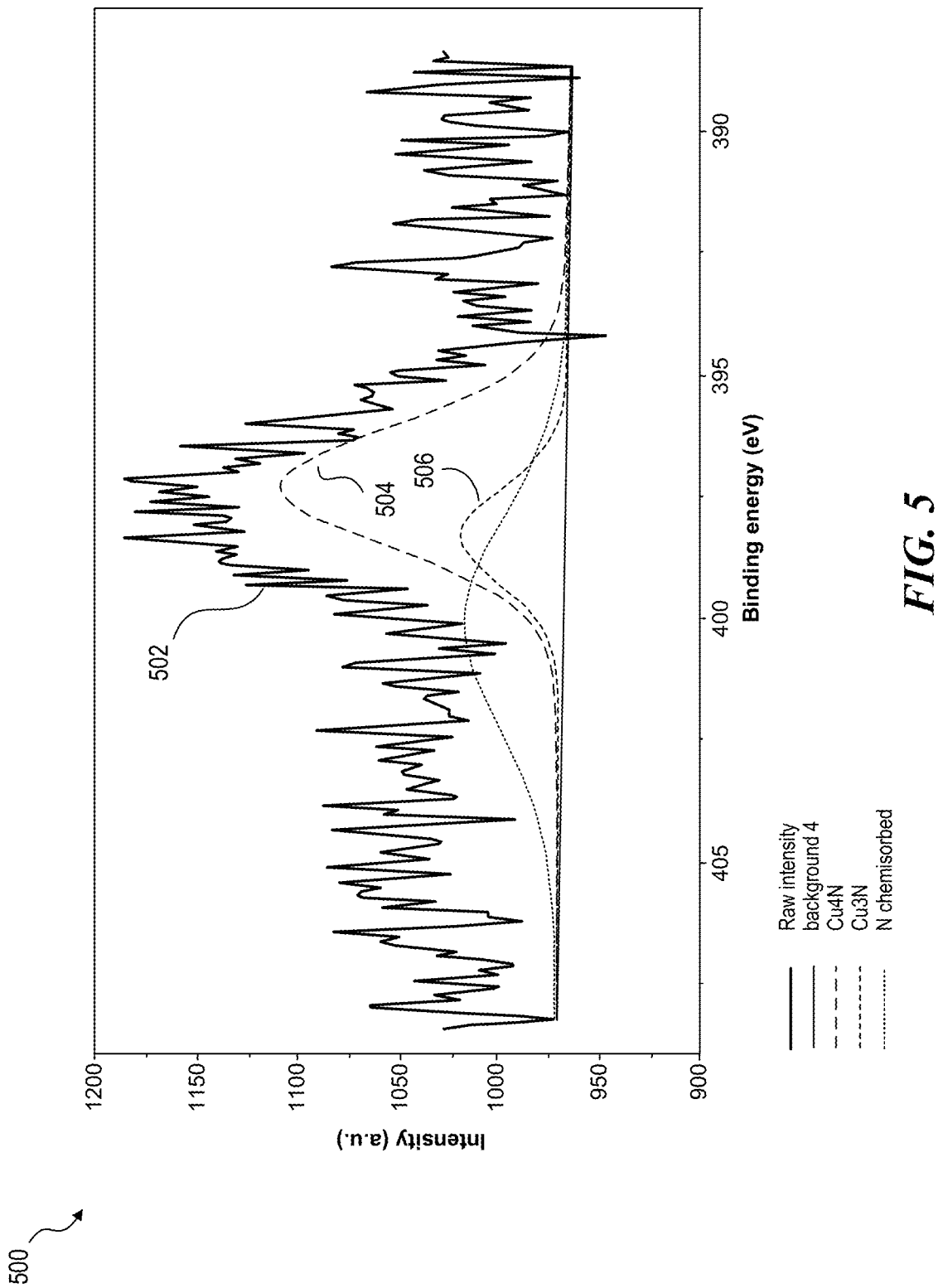
FIG. 5 illustrates an X-ray Photoelectron Spectroscopy spectrum taken from the semiconductor device assemblies according to embodiments of the present technology.

Turning now to FIG. 5 which illustrates an X-ray Photoelectron Spectroscopy (XPS) spectrum 500 taken from the layer 308 region of the semiconductor device assemblies. This XPS spectrum 500 plots the number of electrons (or arbitrary unit intensity) detected as functions of binding energies. As shown, the raw XPS curve 502 can be filtered into two peaks 506 and 504 each corresponds to $Cu_3N$ and $Cu_4N$ with binding energies close to 398.5 eV and 397.5 eV, respectively. A higher intensity of the $Cu_4N$ peak suggests that the decomposition of original deposited $Cu_3N$ has started and most of the layer 308 has decomposed into $Cu_4N$.

Figure 6:
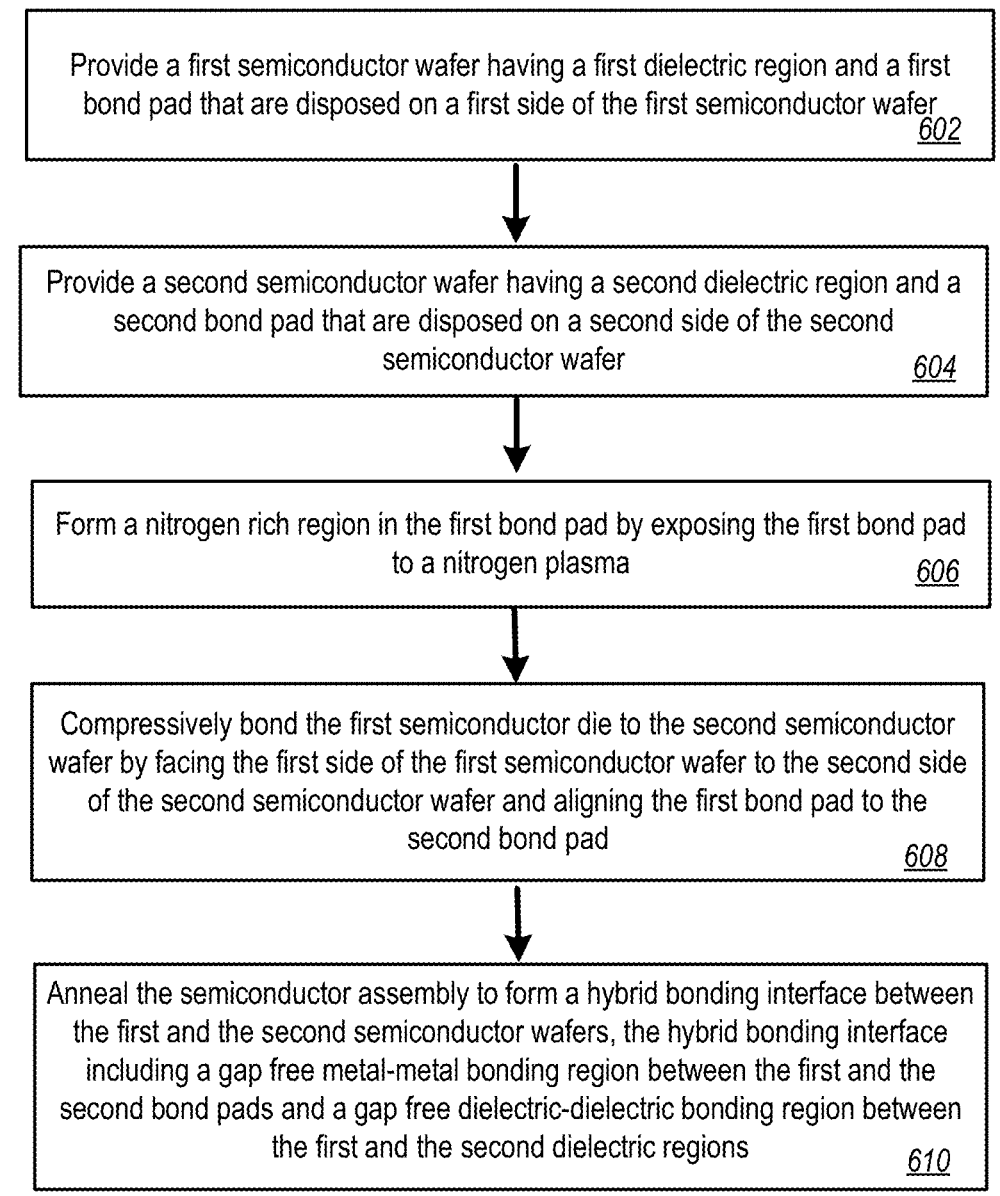
FIG. 6 illustrates a method of hybrid bonding for semiconductor device assemblies according to embodiments of the present technology.

FIG. 6 illustrates a hybrid bonding method 600 for semiconductor device assemblies according to embodiments of the present technology. The method 600 includes providing a first semiconductor die having a first dielectric region and a first bond pad that are disposed on a first side of the first semiconductor die, at 602. For example, the bottom semiconductor die including a dielectric region 304 and a bond pad 302 disposed on its top surface can be introduced to the semiconductor device assemblies as shown in FIG. 3A.

The method 600 also includes providing a second semiconductor die having a second dielectric region and a second bond pad that are disposed on a second side of the second semiconductor die, at 604. For example, the top semiconductor die including the dielectric region 304 and the bond pad 310 disposed on its top surface can also be introduced to the semiconductor device assemblies as shown in FIG. 3C.

In addition, the method 600 includes forming a nitrogen rich region in the first bond pad by exposing the first bond pad to a nitrogen plasma, at 606. For example, the layer 308, e.g., copper nitride, can be grown on the top surface of the bond pad 302 of the bottom semiconductor die, as shown in FIG. 3B. The layer 308 can be formed in a microwave plasma process by flowing nitrogen reaction gas and applying proper plasms power to the bond pad 302. Moreover, the layer 308 may be nano particles disposed on the bond pad 302 with a thickness around 30 nm.

Further, the method 600 includes compressively bonding the first semiconductor die to the second semiconductor die by facing the first side of the first semiconductor die to the second side of the second semiconductor die and aligning the first bond pad to the second bond pad, at 608. For example, the top semiconductor die can be bonded on the bottom semiconductor die by aligning the bond pad 310 with the bond pad 302. Specifically, the layer 308 is sandwiched between the bond pads 310 and 302 and performs as a conductive media to facilitate conductive material diffusion therebetween.

Lastly, the method 600 includes annealing the semiconductor assembly to form a hybrid bonding interface between the first and the second semiconductor dies, the hybrid bonding interface including a gap free metal-metal bonding region between the first and the second bond pads and a gap free dielectric-dielectric bonding region between the first and the second dielectric regions, at 610. For example, the semiconductor device assemblies described in FIGS. 3A through 3D may be processed in a first thermal annealing process to facilitate forming dielectric-dielectric bonds between the dielectric regions 312 and 304. The first thermal anneal process may be conducted at a temperature close to 150° C. and lasts for up to 4 hours or shorter. In addition, the semiconductor device assemblies can be processed in a second thermal annealing process to facilitate forming the metal-metal bonds between the bond pads 310 and 302. The second thermal annealing process can be conducted in a relative lower temperature, e.g., at 250° C. or lower, and lasts for up to 4 hours or shorter. The hybrid bonding interface shown in FIG. 3D includes gap free dielectric-dielectric bonds and metal-metal bonds.

Figure 7:
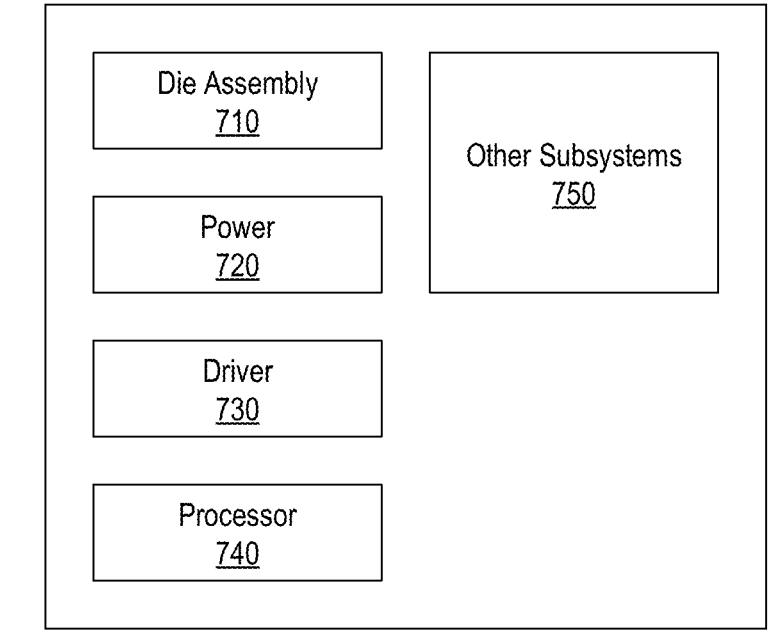
FIG. 7 is a schematic view of a system that includes a semiconductor device configured according to embodiments of the presented technology.

Any one of the semiconductor structures described above with reference to FIGS. 3A-5 can be incorporated into any of a myriad of larger and/or more complex systems, a representative example of which is system 700 shown schematically in FIG. 7. The system 700 can include a semiconductor device 710, a power source 720, a driver 730, a processor 740, and/or other subsystems or components 750. The semiconductor device 710 can include features generally similar to those of the semiconductor devices described above, and can therefore include the composite material and semiconductor device assemblies described in the present technology. The resulting system 700 can perform any of a wide variety of functions, such as memory storage, data processing, and/or other suitable functions. Accordingly, representative systems 700 can include, without limitation, hand-held devices (e.g., mobile phones, tablets, digital readers, and digital audio players), computers, and appliances. Components of the system 700 may be housed in a single unit or distributed over multiple, interconnected units (e.g., through a communications network). The components of the system 700 can also include remote devices and any of a wide variety of computer-readable media.

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

In accordance with one aspect of the present disclosure, the semiconductor devices illustrated above could be memory dice, such as dynamic random access memory (DRAM) dice, NOT-AND (NAND) memory dice, NOT-OR (NOR) memory dice, magnetic random access memory (MRAM) dice, phase change memory (PCM) dice, ferroelectric random access memory (Fe RAM) dice, static random access memory (SRAM) dice, or the like. In an embodiment in which multiple dice are provided in a single assembly, the semiconductor devices could be memory dice of a same kind (e.g., both NAND, both DRAM, etc.) or memory dice of different kinds (e.g., one DRAM and one NAND, etc.). In accordance with another aspect of the present disclosure, the semiconductor dice of the assemblies illustrated and described above could be logic dice (e.g., controller dice, processor dice, etc.), or a mix of logic and memory dice (e.g., a memory controller die and a memory die controlled thereby).

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "top," "bottom," "over," "under," "above," and "below" can refer to relative directions or positions of features in the semiconductor devices in view of the orientation shown in the Figures. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly, comprising:
   a first semiconductor die having a first dielectric region and a first bond pad that are disposed on a first side of the first semiconductor die;
   a second semiconductor die having a second dielectric region and a second bond pad that are disposed on a second side of the second semiconductor die; and
   a hybrid bonding interface between the first side of the first semiconductor die and the second side of the second semiconductor die, the hybrid bonding interface including a gap free metal-metal bonding region between the first and the second bond pads and a gap free dielectric-dielectric bonding region between the first and the second dielectric regions,
wherein the dielectric-dielectric bonding region includes a nitrogen gradient with a concentration that increases with proximity to the metal-metal bonding region.

2. The semiconductor device assembly of claim 1, wherein the first bond pad and the second bond pad comprise copper, and wherein the first dielectric region and the second dielectric region comprise silicon oxide, silicon nitride, or a combination thereof.

3. The semiconductor device assembly of claim 1, wherein the metal-metal bonding region comprises a diffusion metal bond.

4. The semiconductor device assembly of claim 1, wherein the dielectric-dielectric bonding region comprises a dielectric covalent bond.

5. A method of forming a semiconductor device assembly, comprising:
providing a first semiconductor die having a first dielectric region and a first bond pad that are disposed on a first side of the first semiconductor die;
providing a second semiconductor die having a second dielectric region and a second bond pad that are disposed on a second side of the second semiconductor die;
forming a nitrogen rich region in the first bond pad by exposing the first bond pad to a nitrogen plasma;
compressively bonding the first semiconductor die to the second semiconductor die by facing the first side of the first semiconductor die to the second side of the second semiconductor die and aligning the first bond pad to the second bond pad;
annealing the semiconductor device assembly to form a hybrid bonding interface between the first and the second semiconductor dies, the hybrid bonding interface including a gap free metal-metal bonding region between the first and the second bond pads and a gap free dielectric-dielectric bonding region between the first and the second dielectric regions; and
forming a nitrogen gradient at the dielectric-dielectric bonding region, the nitrogen gradient having a concentration that increases with proximity to the metal-metal bonding region.

6. The method of forming the semiconductor device assembly of claim 5, wherein at least one of the first bond pad and the second bond pad has a dished profile formed in a surface planarization process.

7. The method of forming the semiconductor device assembly of claim 5, wherein the nitrogen component decomposes at the metal-metal bonding region and diffuses from the metal-metal bonding region to the dielectric-dielectric bonding region.

8. The method of forming the semiconductor device assembly of claim 5, wherein the first semiconductor die and the second semiconductor die each comprises a plurality of semiconductor dies, the plurality of semiconductor dies of the first semiconductor die and the second semiconductor die are bonded, respectively.

9. The method of forming the semiconductor device assembly of claim 5, wherein the first and the second bond pads comprise copper, and wherein the nitrogen rich region comprises copper nitride.

10. The method of forming the semiconductor device assembly of claim 9, wherein the copper nitride is formed by microwaving the nitrogen plasma.

11. The method of forming the semiconductor device assembly of claim 9, wherein compressively bonding the first semiconductor die to the second semiconductor die includes contacting the copper nitride of the first semiconductor die to the second bond pad of the second semiconductor die.

12. The method of forming the semiconductor device assembly of claim 11, wherein annealing the semiconductor device assembly includes a first annealing process to form covalent dielectric bond between the first and second dielectric regions and a second annealing process to form diffusion metal bond between the first and second bond pads.

13. The method of forming the semiconductor device assembly of claim 5, wherein the compressive bonding is performed with a compression pressure of at least to 1 kg/cm$^2$.

14. The method of forming the semiconductor device assembly of claim 5, wherein the annealing process is performed at a temperature ranging from 250° C. to 350° C. and lasts for a period less than or equal to 4 hours.

15. The method of forming the semiconductor device assembly of claim 5, wherein the nitrogen rich region comprises copper nitride, and wherein the copper nitride decomposes during the annealing process such that a nitrogen content of the copper nitride diffuses away from the metal-metal bonding region between the first and the second bond pads and into the dielectric-dielectric bonding region between the first and the second dielectric regions.

16. A method of forming a semiconductor device assembly, comprising:
providing a first semiconductor die having a first dielectric region and a first bond pad that are disposed on a first side of the first semiconductor die;
providing a second semiconductor die having a second dielectric region and a second bond pad that are disposed on a second side of the second semiconductor die;
forming nitrogen rich regions in the first bond pad and the second bond pad by exposing the first bond pad and the second bond pad to a nitrogen plasma, respectively;
compressively bonding the first semiconductor die to the second semiconductor die by facing the first side of the first semiconductor die to the second side of the second semiconductor die and aligning the first bond pad to the second bond pad;
annealing the semiconductor device assembly to form a hybrid bonding interface between the first and the second semiconductor dies, the hybrid bonding interface including a gap free metal-metal bonding region between the first and the second bond pads and a gap free dielectric-dielectric bonding region between the first and the second dielectric regions; and
forming a nitrogen gradient at the dielectric-dielectric bonding region, the nitrogen gradient having a concentration that increases with proximity to the metal-metal bonding region.

17. The method of forming the semiconductor device assembly of claim 16, wherein the nitrogen component decomposes at the metal-metal bonding region and diffuses from the metal-metal bonding region to the dielectric-dielectric bonding region.

18. The method of forming the semiconductor device assembly of claim 17, wherein the first and the second bond pads comprise copper, and wherein the nitrogen rich regions comprise copper nitride.

19. The method of forming the semiconductor device assembly of claim 18, wherein compressively bonding the first semiconductor die to the second semiconductor die includes contacting the copper nitride disposed on the first bond pad to the copper nitride disposed on the second bond pad.

20. The method of forming the semiconductor device assembly of claim 19, wherein annealing the semiconductor device assembly includes annealing the copper nitride disposed in the metal-metal bonding region so as to decompose the copper nitride, and nitrogen content of the copper nitride diffuses away from the metal-metal bonding region between the first and the second bond pads and into the dielectric-dielectric bonding region between the first and the second dielectric regions.

\* \* \* \* \*